(12) United States Patent
Döllgast et al.

(10) Patent No.: US 7,564,169 B2
(45) Date of Patent: Jul. 21, 2009

(54) PIEZO ACTUATOR AND ASSOCIATED PRODUCTION METHOD

(75) Inventors: Bernd Döllgast, Erlangen (DE); Carsten Schuh, Baldham (DE); Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/595,391

(22) PCT Filed: Oct. 12, 2004

(86) PCT No.: PCT/EP2004/052511

§ 371 (c)(1),
(2), (4) Date: Feb. 1, 2007

(87) PCT Pub. No.: WO2005/035971

PCT Pub. Date: Apr. 21, 2005

(65) Prior Publication Data

US 2007/0267943 A1     Nov. 22, 2007

(30) Foreign Application Priority Data

Oct. 14, 2003   (DE) ................. 103 47 771

(51) Int. Cl.
*H01L 41/083* (2006.01)
(52) U.S. Cl. ............... 310/328; 310/311; 239/533.2; 123/472
(58) Field of Classification Search ........... 310/328
See application file for complete search history.

(56) References Cited

U.S. PATENT DOCUMENTS

| | | | | |
|---|---|---|---|---|
| 3,418,980 A * | 12/1968 | Benson | ............. | 123/294 |
| 4,778,358 A * | 10/1988 | Pape | ............. | 417/500 |
| 5,208,506 A * | 5/1993 | Yamashita | ............. | 310/328 |
| 6,874,475 B2 * | 4/2005 | Katsura et al. | ............. | 123/467 |
| 6,930,438 B2 * | 8/2005 | Cramer et al. | ............. | 310/328 |
| 2002/0053860 A1 * | 5/2002 | Mitarai et al. | ............. | 310/366 |
| 2004/0169438 A1 | 9/2004 | Cramer et al. | ............. | 310/328 |

FOREIGN PATENT DOCUMENTS

| | | |
|---|---|---|
| DE | 19715487 | 10/1998 |
| DE | 19910111 A1 | 10/2000 |
| EP | 1079097 | 2/2001 |
| WO | 03/005490 A2 | 1/2003 |
| WO | 2004/004021 A2 | 1/2004 |
| WO | 2005/035971 A1 | 4/2005 |

OTHER PUBLICATIONS

International Search Report for International Application No. PCT/EP2004/052511 (4 pages), Oct. 12, 2004.
International Written Opinion for International Application No. PCT/EP2004/052511 (2 pages), Oct. 12, 2004.

\* cited by examiner

*Primary Examiner*—Quyen Leung
*Assistant Examiner*—Bryan P Gordon
(74) *Attorney, Agent, or Firm*—King & Spalding L.L.P.

(57) ABSTRACT

A support assembly for a piezoelectric actuator (15), in particular for a piezoelectric actuator for driving an injector for the injection system of an internal combustion engine has a holder (5-10) for spatially securing a piezoelectric stack (2) and two associated connection pins (11, 12) for electrically contacting the stack (2). The support assembly is configured as a single support, which only holds a single piezoelectric stack (2) with two associated connection pins (11, 12).

13 Claims, 4 Drawing Sheets

PIEZO ACTUATOR AND ASSOCIATED PRODUCTION METHOD

CROSS-REFERENCE TO RELATED APPLICATIONS

This application is a U.S. national stage application of International Application No. PCT/EP2004/052511 filed Oct. 12, 2004, which designates the United States of America, and claims priority to German application number DE 103 47 771.3 filed Oct. 14, 2003, the contents of which are hereby incorporated by reference in their entirety.

TECHNICAL FIELD

The invention relates to a piezo actuator, in particular a piezo actuator for actuating an injector for an injection system of an internal combustion engine.

BACKGROUND

In modern injection systems for internal combustion engines, piezo actuators which essentially consist of a stack of multiple layers of piezo elements are increasingly being used to actuate the injectors. Between the individual piezo layers of the stack are electrode layers enabling the immediately adjacent piezo elements to be electrically contacted. Metallizations which extend over the entire length of the stack are additionally provided on two opposite sides of the stack, the electrode layers being electrically connected alternately to one of the two metallizations. However, the actual electrical contacting of the piezo actuator is via two electrically conductive connection pins between which the piezo stack is disposed, the two connection pins each being separately connected to one of the two metallizations of the piezo stack.

To establish the electrical connection between the connection pins and the metallizations of the piezo stack, the piezo stack is normally inserted together with the connection pins in a multiple mount in which the connection pins are fixed in a predefined position relative to the piezo stack, whereupon an electrically conductive wire is wound around the piezo stack and the connection pins in a large number of turns. After the wire has been wound around the piezo stack and connection pins, the individual turns of the wire are then soldered to the metallization and the connection pins, thereby establishing an electrical connection between the metallizations and the associated connection pins. The remaining wire sections between the opposite-polarity connection pins or metallizations are then severed and removed in order to insulate the latter from one another. Passivation is then applied to the piezo stack and a foil is adhesively attached to the edges of the piezo stack as edge protection. Finally the units consisting of a piezo stack and two connection pins are then removed from the multiple mount and inserted in suitable sleeves for encapsulation.

The disadvantage of this known production method for a piezo actuator is firstly the fact that the individual piezo units have to be removed from the multiple mount and inserted in the associate sleeve for encapsulation, which requires an additional operation.

Moreover, during encapsulation the two connection pins of a piezo unit must be precisely aligned by a separate guide until the potting compound has cured, thereby immovably fixing the connection pins in position.

SUMMARY

The object of the invention is therefore to simplify the above described known production method for a piezo actuator wherein the precise orientation of the connection pins of the piezo actuator must be ensured.

This object is achieved by a piezo actuator, in particular a piezo actuator for actuating an injector for an injection system of an internal combustion engine, comprising a holder for spatially fixing a piezo stack and two associated connection pins for electrical contacting of the piezo stack, wherein the holder is implemented as an individual mount for accommodating and holding only a single piezo stack with two associated connection pins.

The holder may have an edge guard for protecting an axially running edge of the piezo stack. The edge protection may have at least one axially running rib which covers an axially running edge of the piezo stack. The edge protection may cover two axially running, opposite edges of the piezo stack. Between the edge guard and the piezo stack there may be a gap large enough to allow a potting compound to penetrate during encapsulation. The axially running edges of the piezo stack may form an at least six-sided polygon with the connection pins and the edge guard in cross-section in order to facilitate wire winding. The polygon can be essentially equilateral in order to allow wire winding with approximately constant wire tension. The connection pins can be fixed in the holder in a form-fit and/or force-fit manner. The connection pins can be extrusion-coated or molded in with the material of the holder. The holder essentially may consist of plastic. The two connection pins can be fixed in the holder in two radial bearings in each case. The two connection pins can be axially fixed in the holder in a thrust bearing in each case. The holder may have a first end plate with a cutout for guiding the piezo stack at one end and a second end plate with a cutout for guiding the piezo stack at its other end, the two end plates being interconnected by ribs. The cutout in the first end plate and/or the cutout in the second end plate can be larger than the cross-sectional area of the piezo stack in order to allow the penetration of potting compound. The holder with the inserted piezo stack and the inserted connection pins can be encapsulated with a potting compound.

The object can also be achieved by a production method for a piezo actuator comprising the following steps: Inserting a piezo stack and two connection pins in an assembly mount, Establishing an electrical connection between the two connection pins and the piezo stack while the piezo stack and the connection pins are inserted in the assembly mount, and Accommodating only a single piezo stack and the two associated connection pinsby the assembly mount.

The production method may comprise the following step: Encapsulating the assembly mount with the inserted piezo stack and the inserted connection pins with a cure-hardening potting compound. The production method may comprise the following steps: Inserting the assembly mount with the inserted piezo stack and the inserted connection pins in a mold and then Encapsulating the assembly mount with the potting compound in the mold. The production method may also comprise the following steps: Winding the assembly mount with the inserted piezo stack and the inserted connection pins with at least one electrically conductive wire, Electrically connecting sections of the wire to one of the two connection pins and one of two terminals of the piezo stack, and Cutting the wire between the contacted wire sections and removing the cut wire sections. The assembly mount may have at least one edge guard in order to protect an axially running edge of the piezo stack. The potting compound can be silicone.

The invention included the general technical teaching of not inserting the individual piezo stacks with the associated connection pins for assembly in a multiple mount together with other piezo stacks and the associated connection pins, but inserting them in an individual mount which only accommodates a single piezo stack with two associated connection pins. The advantage of this is that the piezo actuator can then be encapsulated in the individual mount, said individual mount spatially fixing the connection pins of the piezo actuator so as to obviate the need for a separate guide for the two connection pins. The invention therefore proposes a piezo actuator assembly mount which is implemented as an individual mount for accommodating and holding a single piezo stack with two associated connection pins.

The assembly mount according to the invention preferably has a holder incorporating edge protection in order to protect an axially running edge of the piezo stack during winding with the wire. This edge protection can have, for example, at least one axially running rib which covers the piezo stack edge to be protected. As two opposite edges of the piezo stack are usually mechanically stressed during winding of the piezo unit, the edge protection preferably covers two axially running, opposite edges of the piezo stack. Edge protection of this kind can be implemented, for example, by making the holder of the assembly mount according to the invention cage-shaped and providing it with two end plates which are interconnected by ribs, said ribs between the two end plates additionally serving as edge guards for the piezo stack.

For such edge protection for the piezo stack it is advantageous if a sufficiently large gap remains between the edge guard and the piezo stack to allow penetration of the potting compound during encapsulation of the piezo actuator in the assembly mount. The gap width required for this purpose depends essentially on the viscosity and surface tension of the potting compound used and can be easily determined by simple tests.

For winding the piezo unit with an electrically conductive wire to establish an electrical connection between the connection pins and the associated metallizations of the piezo stack, the piezo unit with the connection pins is normally rotated relative to the wire feed, which during the winding process produces a wire tension which is a function of the rotation speed of the piezo unit and the effective winding radius of the piezo unit. To facilitate wire winding, the axially running edges of the piezo stack preferably form an at least six-sided polygon with the connection pins and the edge guard in cross-section. The advantage of such an implementation of the assembly mount according to the invention is that the wire tension exhibits only slight variations during the winding process.

It should be mentioned in this connection that, in practice, the polygon formed by the edges of the piezo stack, the connection pins and the edge guard has no mathematically precise corners and edges, so that this term is to be understood illustratively. For example, the ribs between the end plates of the cage-shaped holder are in practice well rounded, which does not, however, stand in the way of a polygonal wire winding cross-section within the meaning of the invention.

It is particularly advantageous here if the polygon formed by the edges of the piezo stack, connection pins and edge guard is essentially equilateral in order to reduce wire tension variations during winding. For example, the longest lateral edge of the polygon should be no more than 20% longer than the shortest lateral edge of the polygon, any intermediate values within this interval being possible.

The two connection pins are preferably fixed in a form-fit manner in the holder of the assembly mount according to the invention in order to precisely align the connection pins during the encapsulation process. The advantage of this is that it obviates the need for a separate guide for aligning the connection pins during encapsulation, thereby significantly simplifying production.

The form-fit fixing of the connection pins in the holder of the assembly mount according to the invention can be achieved, for example, by extrusion coating or molding in the connection pins with the holder material (e.g. plastic).

For the spatial orientation of the two connection pins during encapsulation, the latter are preferably fixed in two radial bearings which prevent any transverse movement of the connection pins. Such radial bearings can consist, for example, of bores in the end plates of the cage-shaped holder through which the connection pins are passed.

In the holder, the two connection pins are also preferably fixed axially in a thrust bearing at least unilaterally in each case in order to also precisely position the connection pins axially during encapsulation.

In addition to the inventive assembly mount described above, the invention also includes an associated production method whereby the piezo stack and the associated connection pins are inserted in an assembly mount implemented as an individual mount, as already explained above.

BRIEF DESCRIPTION OF THE DRAWINGS

Other advantageous developments of the invention will now be explained in greater detail together with the description of the preferred exemplary embodiment of the invention with reference to the accompanying drawings, in which.

DETAILED DESCRIPTION

Figure 1:
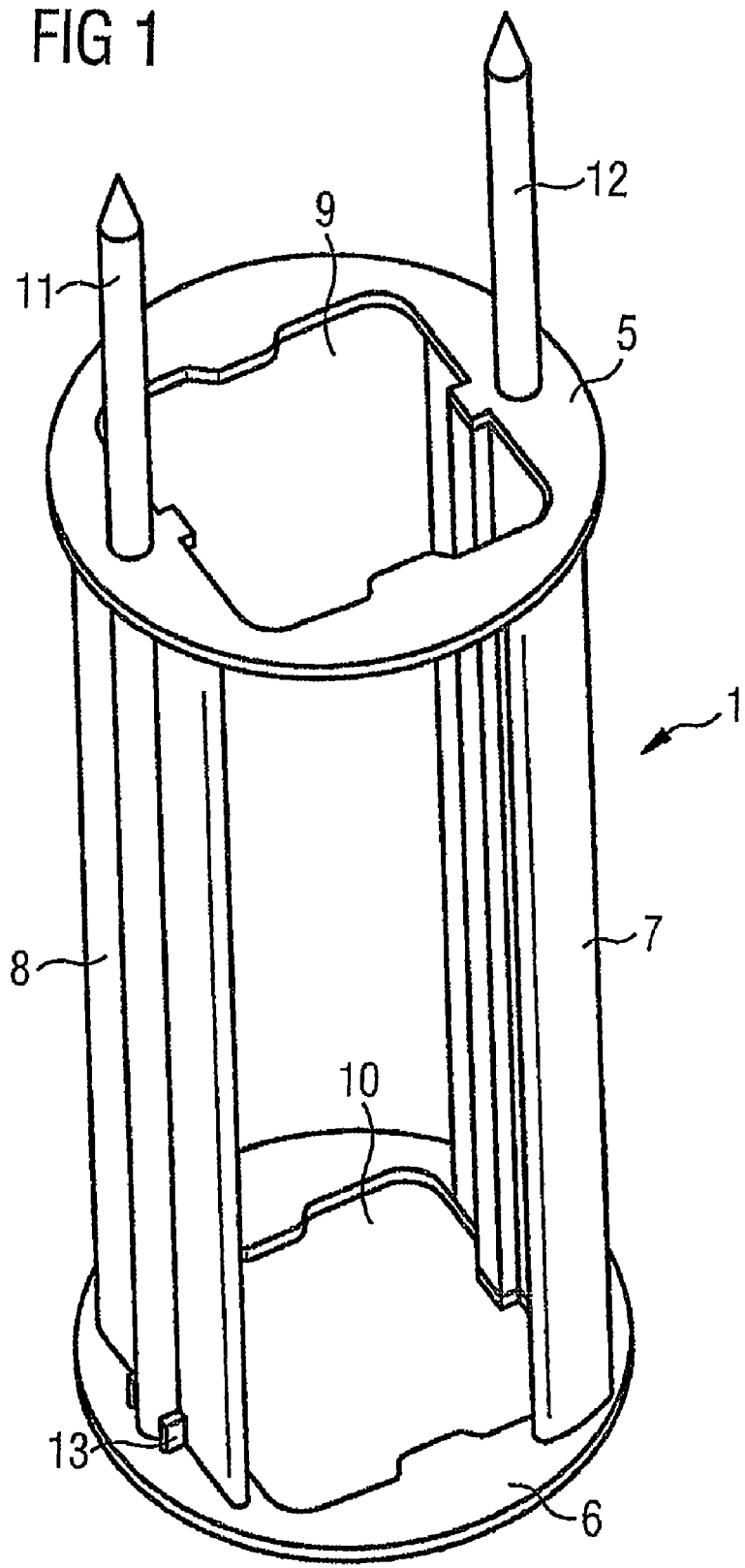
FIG. 1 shows a perspective view of an assembly mount according to the invention.
Figure 2:
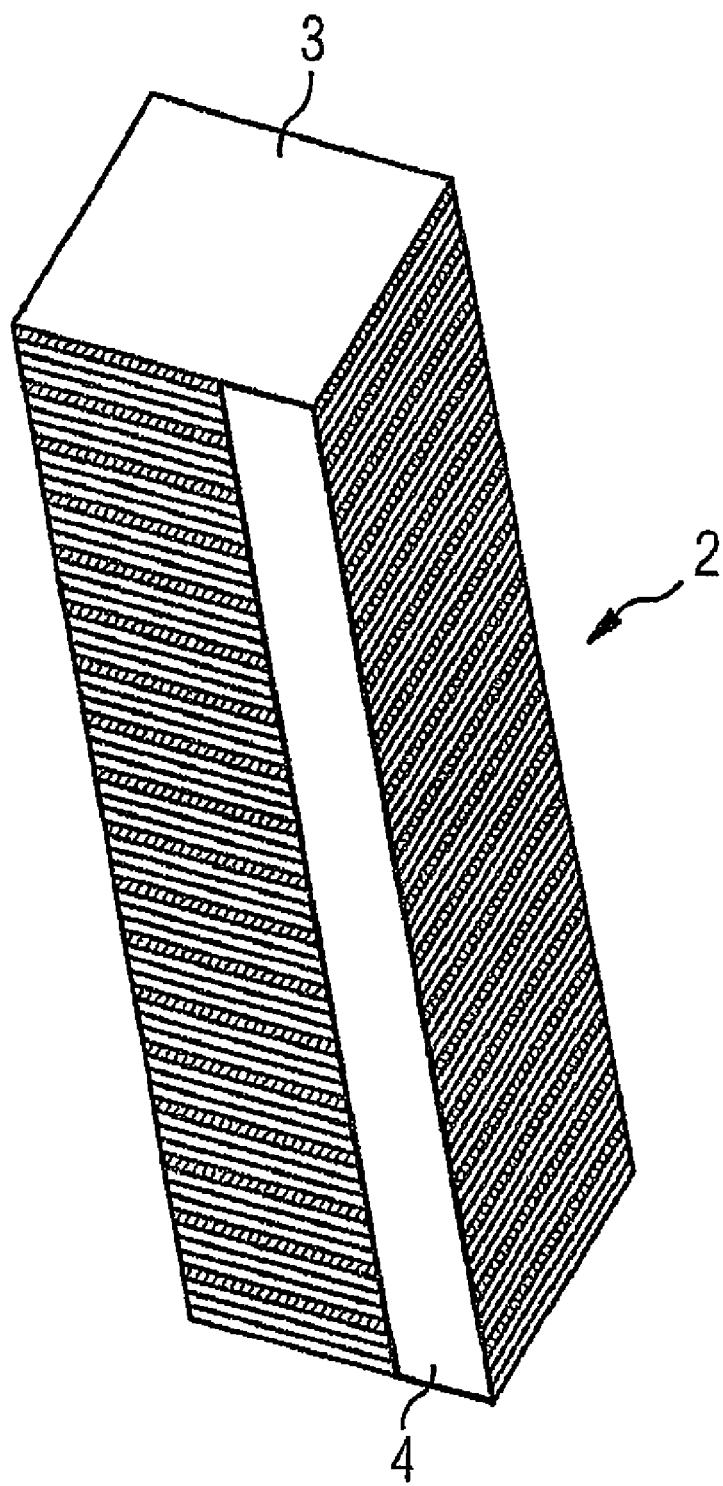
FIG. 2 shows a perspective view of a piezo stack which can be inserted in the assembly mount shown in FIG. 1 for assembling a piezo actuator.

The perspective view in FIG. 1 shows an assembly mount 1 for a piezo stack 2 which is illustrated in detail in FIG. 2 and will be described briefly below.

The piezo stack 2 consists of a plurality of vertically stacked layers of piezo elements 3, an electrode layer being disposed between the individual piezo elements 3.

For electrical contacting of the piezo stack 2, a metallization 4 which extends over the entire length of the piezo stack 2 is applied to two opposite lateral surfaces of the piezo stack, the individual electrode layers of the piezo stack 2 being connected alternately to the metallization 4 and the opposite metallization not shown in the drawing.

For assembly of a piezo actuator, the preassembled piezo stack 2 is inserted in the assembly mount 1. For this purpose the assembly mount 1 is cage-shaped and has two end plates 5, 6 which are interconnected by longitudinally running ribs 7, 8, a cutout 9, 10 being disposed in each of the two end plates 5, 6, through which cutout 9, 10 the piezo stack can be inserted in the assembly mount 1. In the assembled state, the piezo stack 2 then protrudes slightly from the assembly mount 1 in the axial direction through the cutouts 9, 10, said cutouts 9, 10 thereby fixing the piezo stack 2.

In the upper end plate 5, bores to accommodate the connection pins 11, 12 are additionally provided laterally adjacent to the cutout 9, while the lower end plate 6 has a clamp bearing 13 which is molded to the end plate 6 in a monolithic manner and guides the lower end of the connection pins 11 and 12 in the transverse direction, the lower end of the connection pins 11 and 12 resting on the upper side of the end plate 6 and being thereby axially fixed unilaterally so that the two connection pins 11, 12 have the same axial position.

Figure 3:
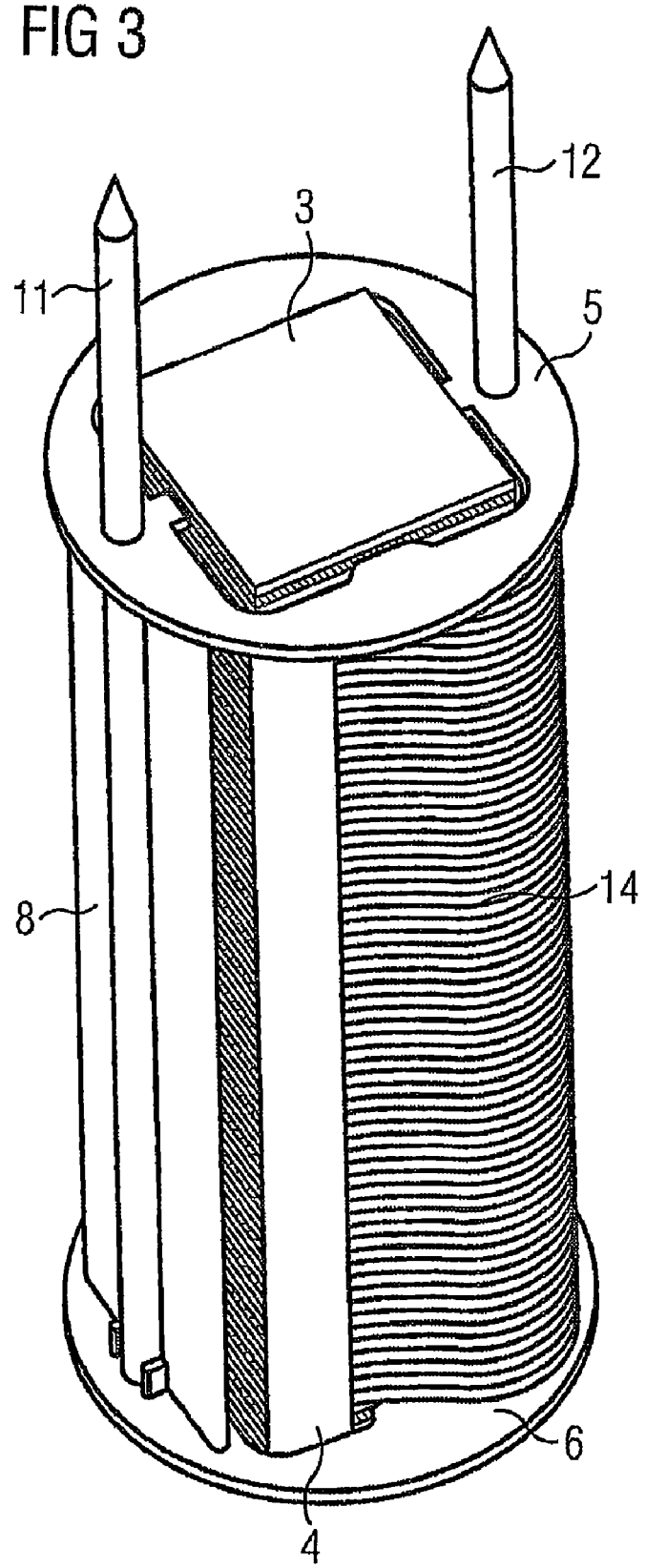
FIG. 3 shows the assembly mount shown in FIG. 1 into which the piezo stack shown in FIG. 2 has been inserted.

When the piezo stack 2 has been inserted in the assembly mount 1, the unit comprising the assembly unit 1 and the piezo stack 2 can then be wound with an electrically conductive wire 14 as shown in FIG. 3.

The wire 14 is then soldered to the two connection pins 11, 12, the metallization 4, and the opposite metallization (not visible) of the piezo stack 2 in order to establish an electrical connection.

The wire sections between the metallization 4 and the connection pin 11 and the wire sections between the connection pin 12 and the opposite metallization are then severed and removed in order to electrically isolate the two metallizations 4 of the piezo stack 2 from one another.

Figure 4:
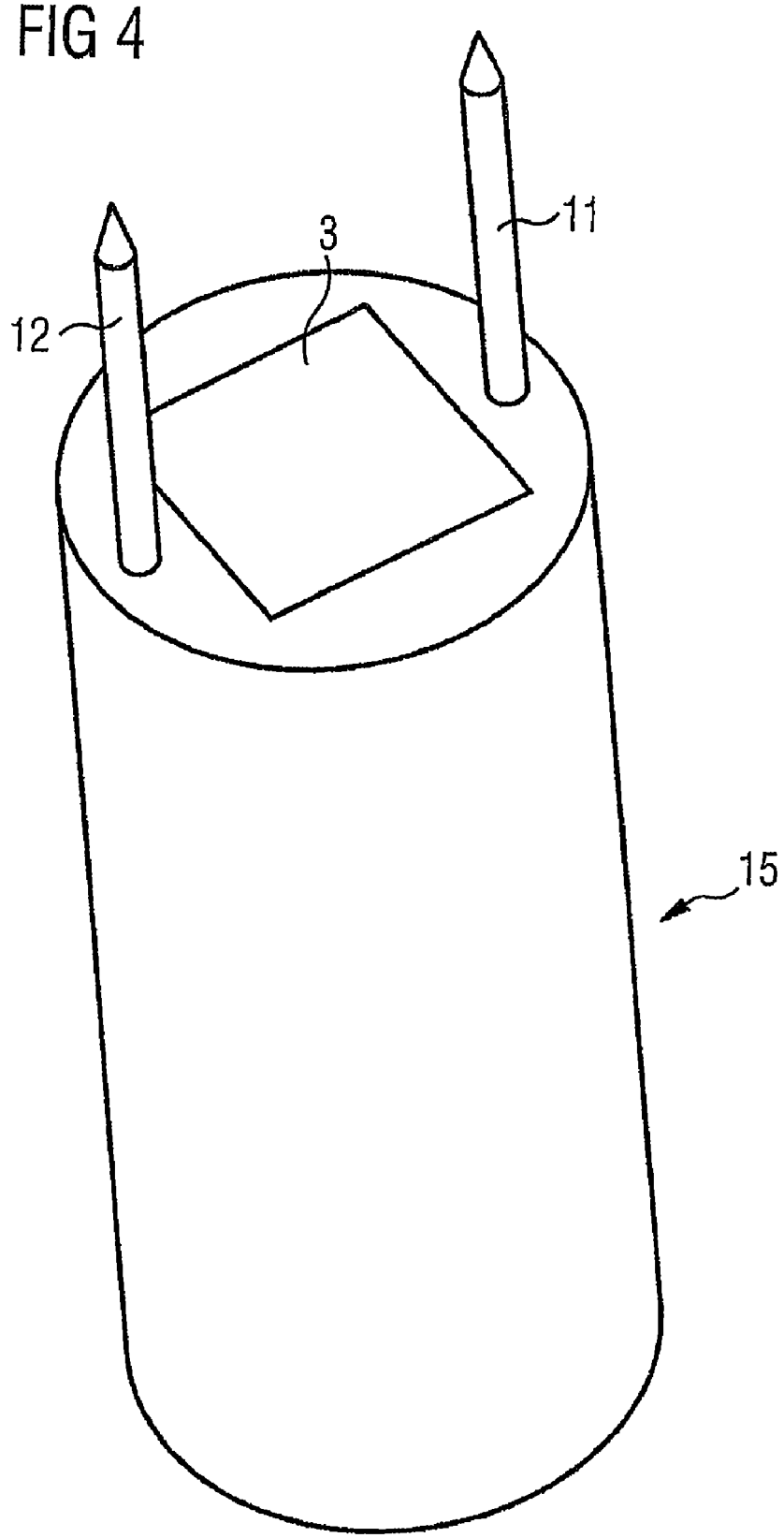
FIG. 4 shows a finished piezo actuator in the encapsulated state.

When the piezo unit has been wound with the wire 14 and the superfluous wire sections have been removed, the piezo unit can then be encapsulated with a potting compound (e.g. silicone) so as to produce, once the potting compound has cured, a finished piezo actuator 15 as illustrated in FIG. 4.

During encapsulation, the assembly mount 1 fixes the two connection pins 11, 12 in a predefined position, which is important for the subsequent electrical contacting of the piezo actuator 15. The advantage of this is the fact that, in contrast to the conventional production method, a separate guide for fixing the connection pins 11, 12 is not required.

It should also be mentioned that the cutouts 9, 10 in the assembly mount 1 are larger than the cross-sectional area of the piezo stack 2 in order to allow the potting compound to penetrate the interspace.

Another particularly advantageous aspect of the assembly mount 1 according to the invention is the fact that the ribs 7, 8 between the end plates 5, 6 of the assembly mount 1 protect the longitudinally running edges of the piezo stack 2 during winding with the wire 14. The ribs 7, 8 are therefore of angular cross-section and cover two opposite edges of the piezo stack 2, there remaining between the ribs 7, 8 and the piezo stack 2 a gap which is large enough to allow potting compound to penetrate.

The invention is not limited to the preferred exemplary embodiment described above. On the contrary, a large number of variants and modifications are possible which likewise make use of the inventive concept and therefore fall within the scope of protection.

What is claimed is:

1. A piezo actuator for actuating an injector for an injection system of an internal combustion engine, comprising a cage-shaped holder for spatially fixing a piezo stack and two associated connection pins for electrical contacting of the piezo stack, wherein the cage-shaped holder comprises a top plate, a bottom plate, and a first rib and a second rib, wherein the first and second rib physically support and couple said top and bottom plate to pre-form said cage-shaped holder, the top plate and the bottom plate each comprise cutouts to receive a single piezo stack inserted into the pre-formed cage-shaped holder.

2. A piezo actuator according to claim 1, wherein the first rib and the second rib are formed such that each protects an axially running edge of the piezo stack.

3. A piezo actuator according to claim 1, wherein the top plate has openings and the bottom plate has clamps for receiving said connection pins.

4. A piezo actuator according to claim 2, wherein the edge protecting ribs cover two axially running, opposite edges of the piezo stack.

5. A piezo actuator according to claim 1, wherein between the edge protecting rib and the piezo stack there is a gap large enough to allow a potting compound to penetrate during encapsulation.

6. A piezo actuator according to claim 3, wherein the connection pins are fixed in the holder in a form-fit and/or force-fit manner.

7. A piezo actuator according to claim 6, wherein the connection pins are extrusion-coated or molded in with the material of the holder.

8. A piezo actuator according to claim 1, wherein the holder essentially consists of plastic.

9. A piezo actuator according to claim 1, wherein the two connection pins are fixed in the holder in two radial bearings, respectively.

10. A piezo actuator according to claim 1, wherein the two connection pins are axially fixed in the holder in respective axial bearings.

11. A piezo actuator according to claim 1, wherein the cutout in the first end plate is larger than the cross-sectional area of the piezo stack in order to allow the penetration of potting compound.

12. A piezo actuator according to claim 1, wherein the cutout in the second end plate is larger than the cross-sectional area of the piezo stack in order to allow the penetration of potting compound.

13. A piezo actuator according to claim 1, wherein the holder with the inserted piezo stack and the inserted connection pins is encapsulated with a potting compound.

* * * * *